US008552728B2

(12) United States Patent
Weiher (10) Patent No.: US 8,552,728 B2
(45) Date of Patent: Oct. 8, 2013

(54) SLUGGISH CIRCUIT BREAKER DETECTION SYSTEM AND METHOD

(75) Inventor: Helmut Weiher, Burton, OH (US)

(73) Assignee: Utility Relay Co., Ltd., Chagrin Falls, OH (US)

( * ) Notice: Subject to any disclaimer, the term of this patent is extended or adjusted under 35 U.S.C. 154(b) by 385 days.

(21) Appl. No.: 12/956,159

(22) Filed: Nov. 30, 2010

(65) Prior Publication Data

US 2011/0128005 A1 Jun. 2, 2011

Related U.S. Application Data

(60) Provisional application No. 61/264,952, filed on Nov. 30, 2009.

(51) Int. Cl.
*G01R 31/02* (2006.01)
*G01R 31/327* (2006.01)

(52) U.S. Cl.
USPC .......................... 324/424; 324/415; 324/423

(58) Field of Classification Search
USPC .......................................... 324/424, 415, 423
See application file for complete search history.

(56) References Cited

U.S. PATENT DOCUMENTS

| 4,433,293 | A | 2/1984 | Aoyagi et al. |
| 5,530,299 | A | 6/1996 | Besslein et al. |
| 5,956,218 | A * | 9/1999 | Berthold ........................ 361/42 |
| 6,215,263 | B1 | 4/2001 | Berkowitz et al. |
| 6,456,025 | B2 | 9/2002 | Berkowitz et al. |
| 2007/0211400 | A1 * | 9/2007 | Weiher et al. ................. 361/115 |
| 2008/0036561 | A1 | 2/2008 | Hartinger et al. |

OTHER PUBLICATIONS

FP5000 Product Overview online document available at http://pps2.com/PDF/BangkokAirport/FP5000.ppt, Eaton Corporation, Date unknown.

* cited by examiner

*Primary Examiner* — Amy He
(74) *Attorney, Agent, or Firm* — Pearne & Gordon LLP (57) ABSTRACT

A circuit breaker electronic trip unit includes a controller, and a memory that stores a threshold tripping duration. The memory is readable by the controller. The trip unit includes a trip signal output, and an input section that receives at least one of a phase current level signal, a phase or line voltage level signal, and a contact state change signal. The trip unit activates the trip signal output and monitors the input section for a predetermined signal change. The trip unit determines a tripping duration from a timing of the activation of the trip signal output and a timing of the predetermined signal change. The trip unit compares the tripping duration to the threshold tripping duration to determine a sluggish circuit breaker operation.

19 Claims, 5 Drawing Sheets

SLUGGISH CIRCUIT BREAKER DETECTION SYSTEM AND METHOD

CROSS-REFERENCE TO RELATED APPLICATIONS

Benefit of U.S. Provisional Patent Application Ser. No. 61/264,952 filed Nov. 30, 2009 is hereby claimed and the disclosure incorporated herein by reference.

BACKGROUND OF THE INVENTION

1. Field of the Invention

The present invention relates to electrical overcurrent protection devices, particularly electronic trip units for circuit breakers.

2. Description of Related Art

Circuit breakers are used in electrical distribution systems to protect electrical conductors and equipment against the effects of short circuits, ground faults, overloads and/or overcurrent conditions (hereinafter "abnormal current conditions"). Some circuit breakers have programmable electronic controllers for controlling operations of the circuit breaker. The programmable electronic controllers are known as electronic trip units and circuit breakers employing electronic trip units are known as electronic trip circuit breakers. The electronic trip unit monitors the conditions of an electrical circuit protected by its associated circuit breaker, and signals the circuit breaker to trip upon detecting an abnormal current condition. Some electronic trip units perform self-testing and provide an indication of detected problems with the trip unit.

BRIEF SUMMARY OF THE INVENTION

In accordance with one aspect of the present invention, provided is a method of determining sluggish operation of a circuit breaker. The circuit breaker includes an actuator. The method includes providing an electronic trip unit for the circuit breaker and setting a threshold tripping duration in the electronic trip unit. A trip signal is sent to the actuator by the electronic trip unit, and the actuator trips the circuit breaker. The electronic trip unit monitors, during the tripping, at least one of a change of a level of electrical current flowing through the circuit breaker, a change of a level of voltage present at the circuit breaker, and a contact state change of a circuit breaker auxiliary contact. The electronic trip unit determines a tripping duration of the circuit breaker from a timing of the step of sending the trip signal to the actuator and a timing of the at least one of the change of the level of electrical current, the change of the level of voltage, and the contact state change of the circuit breaker auxiliary contact. The tripping duration corresponds to a length of time required for the circuit breaker to open. The electronic trip unit compares the tripping duration to the threshold tripping duration to determine a sluggish operation of the circuit breaker.

In accordance with another aspect of the present invention, provided is a circuit breaker electronic trip unit. The electronic trip unit includes a controller, and a memory that stores a threshold tripping duration. The memory is readable by the controller. An input section receives at least one of a phase current level signal, a phase or line voltage level signal, and a contact state change signal. The trip unit includes a trip signal output. The trip unit activates the trip signal output and monitors the input section for a predetermined signal change. The trip unit determines a tripping duration from a timing of the activation of the trip signal output and a timing of the predetermined signal change. The trip unit compares the tripping duration to the threshold tripping duration to determine a sluggish circuit breaker operation.

DETAILED DESCRIPTION OF THE INVENTION

An arc flash during a fault could harm nearby persons and/or property. Such harm could be mitigated by reducing the potential arc flash energy of the arc flash. One equation for determining potential arc flash energy in a cubic box is:

$$E = 1038.7 \times D^{-1.4738} \times t \times (0.0093 \times F^2 - 0.3453 \times F + 5.9675) \quad \text{(equation 1)}$$

where E is the energy level in cal/cm$^2$ in a box not larger than 20 inches, D is the distance from an electrode in inches (for distances of 18 inches and greater), t is the arc duration in seconds, and F is available fault current in kA (for the range of 15 to 50 kA). From equation 1, it can be seen that at a given distance, potential arc flash energy can be reduced by shortening the duration of the arc.

The arc flash energy level has been used to determine a "Risk Hazard Category" (RHC) for an arc flash boundary around electrical equipment. For example, NFPA 70E, promulgated by the National Fire Protection Association, provides Category 0 through Category 4, respectively corresponding to 0-2 cal/cm$^2$, 2-4 cal/cm$^2$, 4-8 cal/cm$^2$, 8-25 cal/cm$^2$, and 25-40 cal/cm$^2$. The personal protective equipment (PPE) required for personal protection when working within the arc flash boundary is determined according to the RHC number.

The RHC is typically calculated and then posted near the electrical equipment. From equation 1, it is to be appreciated that the RHC calculation is based on the available fault current, the working distance from arc electrodes and the clearing time of an upstream circuit breaker. The RHC number of the electrical equipment, and the required PPE when working on the equipment, can be minimized by ensuring that the upstream circuit breaker operates as quickly as possible to clear a fault.

For a circuit breaker with an electronic trip unit, the clearing time duration includes: (a) the trip unit power up time duration; (b) the trip unit sampling and calculation time duration; (c) the actuator time duration; (d) the breaker mechanism unlatch and travel time duration; and (e) the arc interruption time duration.

The breaker mechanism is a mechanical device that typically has lubricated bearings, lubricated rotating and sliding points and springs. An assumption is made in calculating the RHC that the breaker mechanism is in good working order and that, when required to interrupt a fault, the breaker mechanism will unlatch and move the contacts with sufficient speed to extinguish the arc in the expected time. However, the circuit breaker might malfunction by opening more slowly than expected, which is a sluggish operation of the circuit breaker. A sluggish breaker operation is therefore characterized by a greater than normal breaker opening time. Sluggish operation can be caused by, among other things, dried out and stiff lubrication in bearings and sliding contacts. An extreme form of sluggish operation is a "stuck breaker" condition, in which the circuit breaker fails to open. A stuck breaker can be caused by stiff bearings, welded contacts, broken opening springs, etc.

Figure 1:
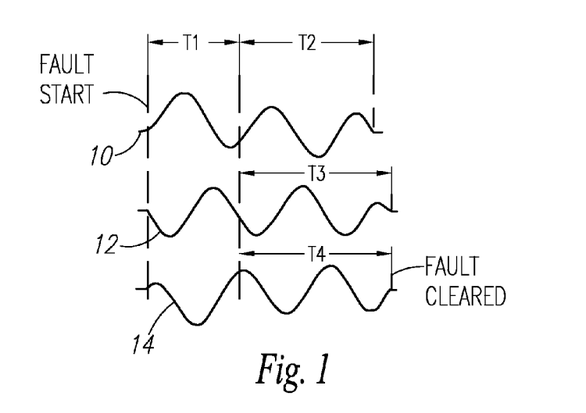
FIG. 1 is a graph showing example phase currents.
Figure 2:
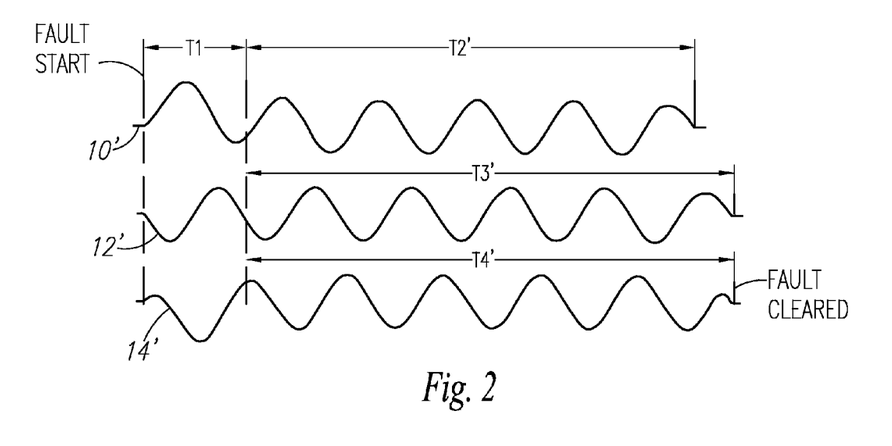
FIG. 2 is a graph showing example phase currents.

An example of the affect of sluggish breaker operation on arc flash incident energy and RHC is discussed below with reference to FIGS. 1 and 2. FIGS. 1 and 2 show three phase currents, 10, 12, 14 and 10', 12', 14', from the beginning of a fault until the fault is cleared. FIG. 1 shows the clearing of a fault by a circuit breaker operating at normal speed. It can be seen that the fault is cleared in less than 3 cycles. Time T1 represents the time it takes for the trip unit to recognize the fault and signal the actuator to trip the circuit breaker. Times T2-T4 and T2'-T4' represent the time it takes for the actuator to unlatch the breaker mechanism and for the breaker to clear the fault. FIG. 2 shows the clearing of a fault by a sluggish circuit breaker. In FIG. 2, times T2'-T4' are much longer than times T2-T4, and the fault lasts for approximately 6 cycles.

With an AC power source operating at 60 Hz, the arc duration in FIG. 1 is approximately 0.0463 seconds. In FIG. 2, the arc duration is approximately 0.1009 seconds. For both FIGS. 1 and 2, assume an available fault current of 36 kA and a distance of 18 inches to the arc electrodes. Using equation 1, the calculated arc flash incident energy for the circuit breaker of FIG. 1 is 3.80 cal/cm$^2$, which corresponds to an RHC of 1. The calculated arc flash incident energy for the circuit breaker of FIG. 2 is 8.28 cal/cm$^2$, which corresponds to an RHC of 3.

The example of FIGS. 1 and 2 show how a sluggish breaker operation can significantly increase the RHC. An operator or maintenance person will typically not know that a circuit breaker is sluggish, and will rely on the calculated and posted RHC (corresponding to a normal breaker speed) to select PPE. The selected PPE will not be suitable for the increased arc flash incident energy of the sluggish breaker, thereby exposing the operator/maintenance person to injury.

It is desirable to keep the RHC at the originally calculated and posted value for the safety of persons and property. Therefore, it would be useful to determine a sluggish circuit breaker condition when it exits, so that the condition can be corrected. However, the act of opening the breaker and removing it from service for maintenance testing exercises the breaker. If the sluggish condition is due to a lubrication problem and/or bad bearings, subsequent breaker operations can be normal or almost normal because the breaker was exercised when opened and removed from service (e.g., the dried out and stiff lubrication has now moved). If, after testing, the breaker is allowed to remain closed for an extended period of time, the next operation can be sluggish. This characteristic makes it difficult to detect a sluggish breaker condition through normal maintenance. The act of opening the breaker and removing it from service for testing exercises the breaker, and it might operate with normal or close to normal speed during the testing. Obtaining data from the first operation of the breaker after it has been closed for an extended period of time is therefore useful in detecting a sluggish breaker condition.

Since the electronic trip unit initiates a breaker trip operation, it is in a unique position to monitor the first operation of the breaker after it has been closed for an extended period of time. An electronic trip unit is discussed below that is able to automatically determine a sluggish circuit breaker operation and a stuck breaker condition. The electronic trip unit can provide an appropriate indication or alarm, and also trip an upstream circuit breaker, if a sluggish operation or a stuck breaker is detected. Maintenance can then be performed on the malfunctioning circuit breaker to return its operating speed to a normal or otherwise safe speed, to thereby keep the RHC of protected downstream equipment at the expected posted level.

Figure 3:
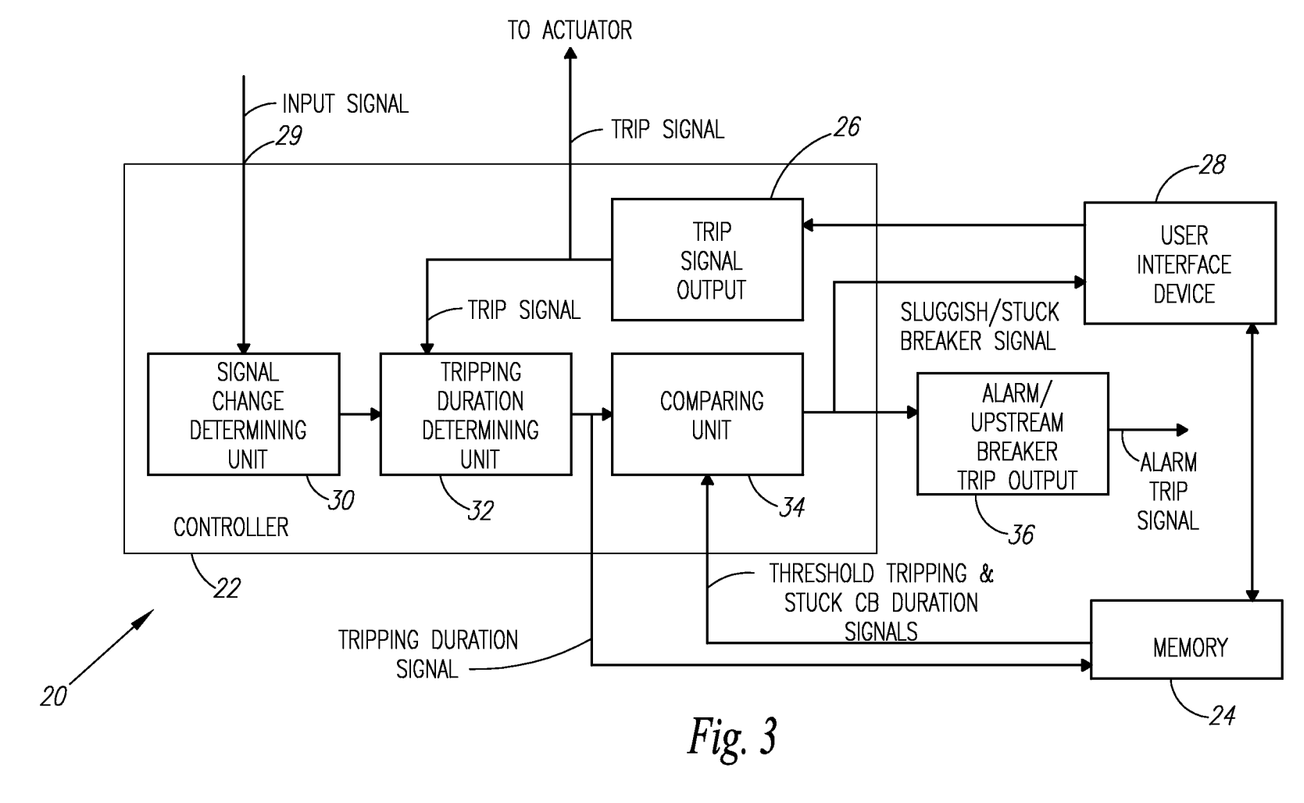
FIG. 3 is schematic block diagram.

A schematic block diagram of a portion of the electronic trip unit 20 is provided in FIG. 3.

The electronic trip unit 20 includes a controller 22. The controller 22 can be an electronic controller and may include a processor. The controller 22 can include one or more of a microprocessor, a microcontroller, a digital signal processor (DSP), an application specific integrated circuit (ASIC), a field-programmable gate array (FPGA), discrete logic circuitry, or the like. The electronic trip unit 20 includes a memory 24 (e.g., RAM or ROM). The memory 24 can store program instructions that cause the controller to provide the functionality ascribed to it herein.

The electronic trip unit 20 includes a trip signal output 26 that provides a trip signal to an actuator (shown in FIGS. 5-6) of the circuit breaker, in order to trip the circuit breaker. The trip signal is provided when abnormal current conditions are detected, when a manual trip is initiated, etc. The electronic trip unit further includes a user interface device 28. The user interface device 28 can provide information to a user via one or more indicator lights (e.g., LED indicators) and/or an alphanumeric display (e.g., an LCD display). The information provided to the user via the interface device 28 can include various settings (e.g., trip setpoints), present operating conditions (e.g., voltage and current levels), alarm conditions including sluggish and stuck breaker conditions, historical data, etc. The user interface device 28 can also include user input devices, such as pushbuttons, touchpads, etc., that allow the user to set various parameters (e.g., pickup settings, delay settings, etc.) of the electronic trip unit 20, manually initiate the trip signal to trip the circuit breaker, acknowledge alarms, etc. The user interface device 28 can communicate, either directly or indirectly, with the trip signal output 26 to force a manual trip, and with the memory 24 to store data into the memory and read data from the memory.

The controller 22 determines the occurrence or non-occurrence of a sluggish breaker operation by calculating the duration or time lag between generating the trip signal and the opening of the circuit breaker, and comparing the time lag to a threshold tripping duration. The electronic trip unit 20 determines that the circuit breaker is open based on an input signal provided to an input section 29 of the trip unit. Example input signals include phase current level signals at the circuit breaker, phase and line voltage level signals at the circuit breaker, and auxiliary contact state change signals (e.g., contact closure or opening) from circuit breaker auxiliary contacts. The controller 22 includes a signal change determining unit 30 that receives the input signal. The signal change determining unit 30 monitors the input signal for a predetermined signal change that is indicative of an open breaker condition. For example, the signal change determining unit 30 monitors the input signal for a predetermined drop in current or voltage level (e.g., to 0 A or 0V), or the occurrence of an auxiliary contact closure. It is to be appreciated that the electronic trip unit 20 can monitor multiple input signals (e.g., three phase current level signals) and determine the open breaker condition based on one or more of the multiple input signals.

It is to be appreciated that the input signal can also be used to determine the existence of an abnormal current condition for tripping the circuit breaker. For example, if the input signal is a phase current, it can be used to determine both the existence of an overcurrent condition and the opening of the circuit breaker.

When the signal change determining unit 30 senses the predetermined signal change, it outputs a signal to a tripping duration determining unit 32. The tripping duration determining unit 32 calculates a tripping duration as the time difference between the timing of the activation of the trip signal and the timing of the predetermined signal change. In an embodiment, the tripping duration determining unit can calculate multiple tripping durations based on multiple input signals (e.g., three phase current level signals). The tripping duration determining unit 32 outputs the tripping duration to a comparing unit 34. The tripping duration determining unit 32 can also output the tripping duration to the memory 24 for historical recordation.

The comparing unit 34 obtains a threshold tripping duration from the memory 24 and compares the calculated tripping duration to the threshold tripping duration. If the calculated tripping duration equals or exceeds the threshold tripping duration, then a sluggish circuit breaker operation has occurred. Alternatively, a predetermined time delay (e.g., 0.010 seconds) can be added to the threshold tripping duration, and the sum compared to the calculated tripping duration to determine a sluggish circuit breaker operation.

The comparing unit 34 also obtains a stuck circuit breaker duration from the memory 24. The stuck breaker duration is longer than the threshold tripping duration. If the calculated tripping duration exceeds the stuck breaker duration, or if the breaker fails to open, then a stuck breaker condition has occurred.

The electronic trip unit 20 includes an alarm/upstream breaker trip output 36. The trip unit 20 can be programmed to activate various outputs (e.g., normally closed and/or normally open contacts) from the alarm/upstream breaker trip output 36 when a sluggish or stuck circuit breaker is detected. For example, when a sluggish breaker operation is detected, a remote alarm can be triggered by a contact closure from the alarm/upstream breaker trip output 36. When a stuck breaker is detected, which is more serious than a sluggish breaker, an upstream circuit breaker can be tripped by a different contact in the alarm/upstream breaker trip output 36.

Sluggish and stuck breaker conditions can be communicated from the comparing unit 34 to the user interface device 28 for presentation to the user.

The threshold tripping duration and stuck circuit breaker duration can be entered into the electronic trip unit 20 manually by a user through the user interface device 28 or derived from a manually input duration or other information. In an embodiment, the user can enter information about the circuit breaker (e.g., model number) into the trip unit, and the trip unit can determine the threshold tripping duration based on the entered information, (e.g., using a lookup table). The threshold tripping and stuck circuit breaker durations can be downloaded into the electronic trip unit 20 from a remote device, such as a remote display panel, remote workstation, or downloaded from a laptop computer temporarily connected to the trip unit. The threshold tripping and stuck circuit breaker durations can be determined automatically by the trip unit 20. In an embodiment, the electronic trip unit 20 automatically determines the threshold tripping duration and/or stuck circuit breaker duration from historical data. For example, the trip unit 20 can calculate the threshold tripping duration based on one or more previous tripping durations and based on one or more electrical phases.

The threshold tripping duration can be determined based on a normal operating time for the particular type of circuit breaker that the trip unit 20 controls. For example the user or the trip unit can add a fixed time delay (e.g., 0.010 seconds) to the normal operating time, and the sum can be used as the threshold tripping duration. Alternatively, a percentage (e.g., 30%) time delay can be added to the normal operating time to determine the threshold tripping duration.

The normal operating time can be based on data from the circuit breaker manufacturer or based on historical tripping duration data recorded by the trip unit 20 (e.g., previous tripping durations of previous tripping operations). The historical tripping duration data can include data on multiple electrical phases (e.g., phases A, B and C in a three-phase system). The slowest phase to open can be used to determine the threshold tripping duration, or the tripping durations of the phases can be averaged. Further, historical tripping duration data from several previous trips can be averaged, either by the user or the trip unit, and the averaged data used to determine the threshold tripping duration.

It is to be appreciated that there are many ways for the user or the trip unit to determine the normal operating time of the circuit breaker and/or the threshold tripping duration. Some numerical examples are provided below.

Example 1

A normal circuit breaker mechanism operating time for a low voltage (e.g., 600V) airframe power circuit breaker might be 0.030 seconds. Adding a time delay of 0.010 seconds provides a threshold tripping duration of 0.040 seconds.

Example 2

The previous tripping durations (as recorded by the trip unit 20) for phases A-C of a previous tripping operation are: Phase A=0.026 seconds, Phase B=0.029 seconds, Phase C=0.029 seconds. The slowest phase is selected from the measured data (0.029 seconds) and a delay of 0.01 seconds is added, resulting in a threshold tripping duration of 0.039 seconds.

Example 3

The previous tripping durations for phases A-C of a previous tripping operation are: Phase A=0.026 seconds, Phase B=0.029 seconds, Phase C=0.029 seconds. The slowest phase is selected from the measured data (0.029 seconds) and a delay of 30% is added, resulting in a threshold tripping duration of 0.029 seconds×1.3=0.038 seconds.

Example 4

The previous tripping durations for phases A-C of a previous tripping operation are: Phase A=0.026 seconds, Phase B=0.029 seconds, Phase C=0.029 seconds. The previous tripping durations are averaged (0.028 seconds) and a delay of 0.01 seconds is added, resulting in a threshold tripping duration of 0.038 seconds.

Example 5

The previous tripping durations for phases A-C of a previous tripping operation are: Phase A=0.026 seconds, Phase B=0.029 seconds, Phase C=0.029 seconds. The previous tripping durations are averaged (0.028 seconds) and a delay of 30% is added, resulting in a threshold tripping duration of 0.028 seconds×1.3=0.036 seconds.

Examples 2-5 above use the previous tripping durations for phases A-C of one previous tripping operation to determine the threshold tripping duration. However, it is to be appreciated data from multiple previous tripping durations can be used to determine the threshold tripping duration, such as by averaging the historical data.

If no historical data is available, then a default threshold tripping duration can be used, such as 0.040 seconds for example. Further, if the calculated threshold tripping duration exceeds a predetermined maximum value, such as 0.050 seconds, then the predetermined maximum value can be used as the threshold tripping duration instead of the calculated duration.

Figure 4:
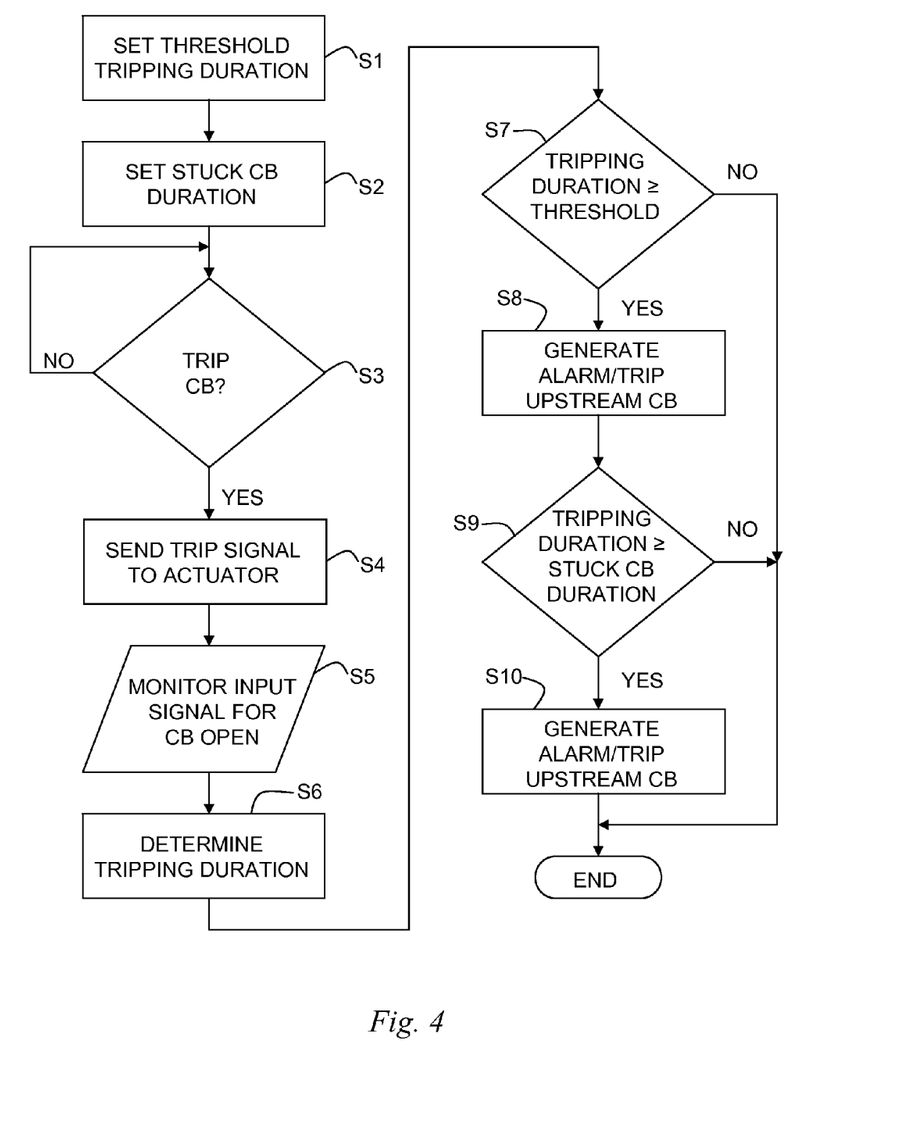
FIG. 4 is a flowchart.

A flowchart showing an example overview method for determining a sluggish circuit breaker operation and a stuck breaker condition is provided at FIG. 4. At steps S1 and S2, respectively, the threshold tripping duration and the stuck circuit breaker duration are set in the electronic trip unit. As discussed above, the setting steps can be performed manually by a user or automatically by the electronic trip unit.

The electronic trip unit then waits for a trip condition (step S3), such as an abnormal current condition or a manual trip input. When a trip condition occurs, the electronic trip unit sends the trip signal to the actuator (step S4), so that the actuator trips the circuit breaker.

During the tripping, the electronic trip unit monitors the input signal 29 (see FIG. 3) for a signal change that is indicative of an open circuit breaker (step S5). As discussed above, example signal changes that correspond to an open circuit breaker include a drop in phase current level to 0 A, a drop in phase or line voltage to 0V, and a circuit breaker auxiliary contact closure or opening signal.

The electronic trip unit determines a tripping duration of the circuit breaker (step S6) from a timing of step S4 and a timing of step S5. In an embodiment, determining the tripping duration includes starting a count-up timer upon sending the trip signal to the actuator. The count-up timer is stopped when the circuit breaker is determined to be open, and its value is the tripping duration.

The electronic trip unit compares the tripping duration to the threshold tripping duration (step S7). If the tripping duration is greater than or equal to the threshold tripping duration, then the electronic trip unit generates an alarm signal and/or generates a signal to trip an upstream circuit breaker (step S8).

The electronic trip unit also compares the tripping duration to the stuck circuit breaker duration (step S9). If the tripping duration is greater than or equal to the stuck circuit breaker duration, then the electronic trip unit generates an alarm signal and/or generates a signal to trip an upstream circuit breaker (step S10).

It is to be appreciated that the sluggish and stuck breaker alarm/upstream breaker trip outputs can be activated as the count-up timer passes the threshold tripping and stuck circuit breaker durations, respectively. Such operation will allow for proper alarming and/or tripping of an upstream circuit breaker even if the monitored circuit breaker never opens (e.g., due to welded contacts).

It is to be appreciated that the functionality of the electric trip unit described herein can be achieved using various techniques. For example, separate count-up timers could be used in determining sluggish and stuck circuit breaker conditions, or one or more count-down timers could be used, or a combination of count-up and count-down timers could be used.

Figure 5:
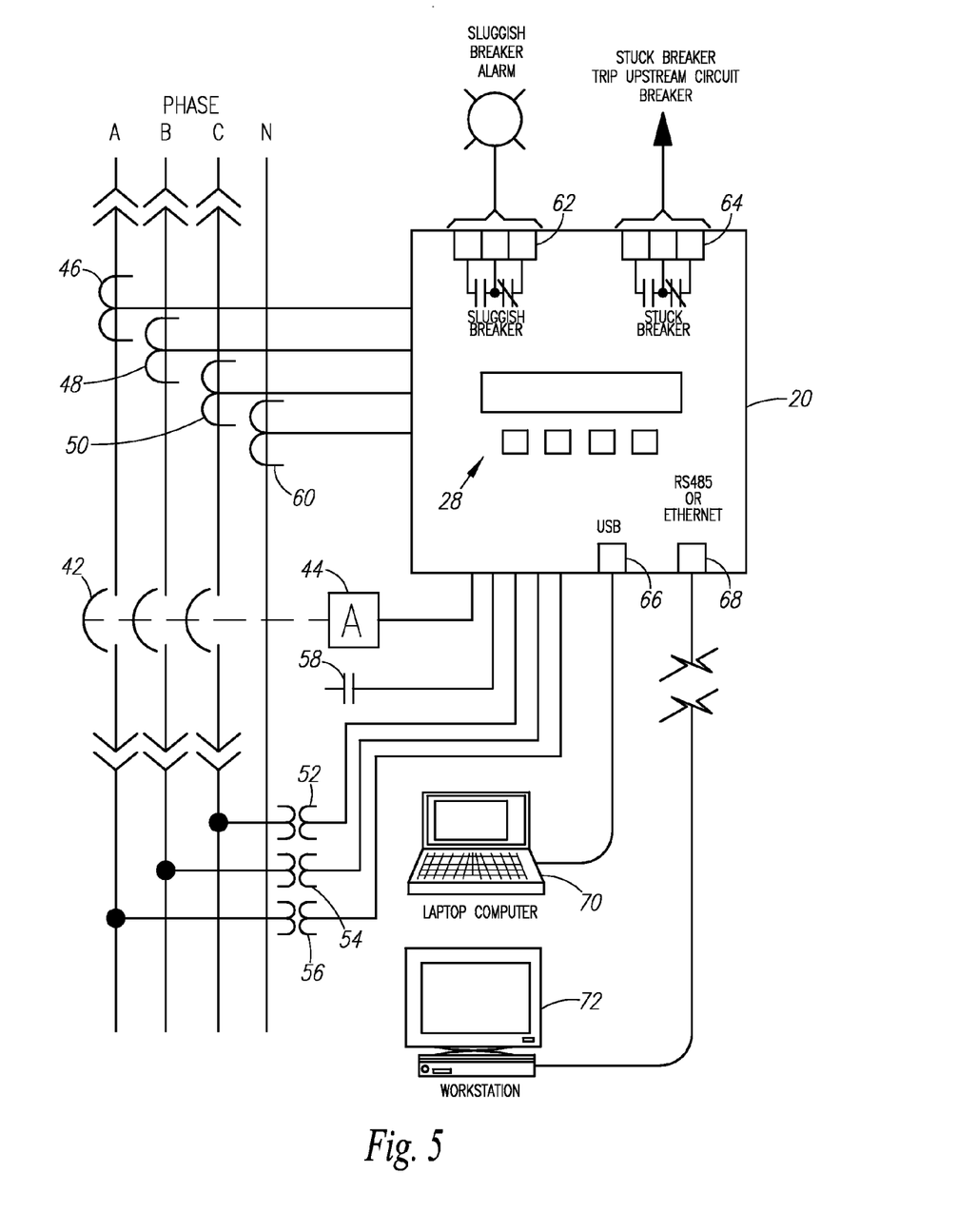
FIG. 5 is a schematic diagram of a circuit protection system.
Figure 6:
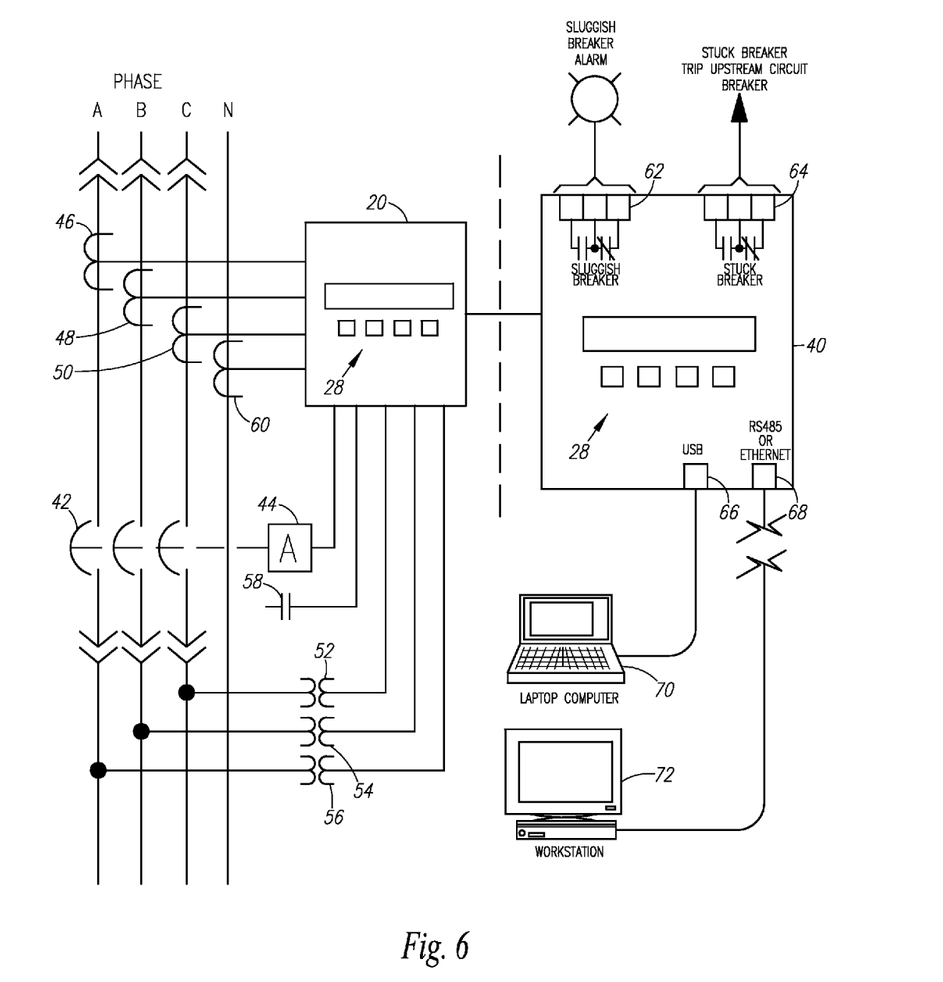
FIG. 6 is a schematic diagram of a circuit protection system.

Example circuit protection systems employing the electronic trip unit 20 are shown in FIGS. 5 and 6. FIGS. 5 and 6 are similar; the primary difference being that FIG. 6 includes a local interface 40 in communication with the trip unit 20, but located outside of the circuit breaker enclosure. It is to be appreciated that the local interface 40 can provide substantially the same functionality as the trip unit 20 with respect to user interface and alarm functions, but from outside of the circuit breaker enclosure.

The circuit protection system includes a circuit breaker 42 and its actuator 44, which receives the trip signal from the electronic trip unit 20. Three electrical phase conductors (phase A, phase B, phase C) are opened by the circuit breaker 42. A neutral conductor N is not opened by the circuit breaker 42. Current transformers (CTs) 46, 48, 50 on the phase conductors provide phase current level signals that are monitored by the electronic trip unit 20. The electronic trip unit 20 uses the phase current level signals to determine the existence of abnormal current conditions. The electronic trip unit 20 can use the phase current level signals to determine when the circuit breaker 42 has opened (e.g., when the phase currents are 0 A). Similarly, potential transformers (PTs) 52, 54, 56 provide phase or line voltage level signals to the electronic trip unit 20. The electronic trip unit 20 can use the phase or line voltage level signals to determine the existence of an open circuit breaker condition. An auxiliary contact 58 on the circuit breaker provides a contact state change (e.g., contact closure or opening) signal to the electronic trip unit 20, which indicates whether the circuit breaker 42 is open or closed. A CT 60 can be provided on the neutral conductor N to provide a neutral current level signal to the electronic trip unit 20, and the electric trip unit can determine the existence of abnormal current conditions based on the neutral current level signal.

The electronic trip unit 20 and/or the local interface 40 includes switched outputs 62, 64 (e.g., relay outputs) for activating remote alarms (e.g., an annunciator panel alarm), for monitoring by remote devices (e.g., a programmable logic controller or supervisory control and data acquisition system) and/or for tripping another circuit breaker (e.g., an upstream circuit breaker). The switched outputs 62, 64 correspond to the various outputs from the alarm/upstream breaker trip output 36 shown in FIG. 3. The switched outputs 62, 64 can include both normally open and normally closed contacts. The switched outputs 62, 64 can be operated independently of each other. For example, switched output 62 can be used as a sluggish circuit breaker alarm output that is activated when a sluggish circuit breaker condition is sensed and, optionally, when a stuck circuit breaker is sensed. The switched output 64 can be used as an upstream circuit breaker trip output that is activated when a stuck circuit breaker is detected, and, optionally, when a sluggish circuit breaker is detected. The electronic trip unit 20 and/or the local interface 40 can include additional analog (e.g., 4-20 mA) and digital outputs whose operations are programmable through the user interface device 28.

The electronic trip unit 20 and/or the local interface 40 can include communication ports 66, 68 for providing communications with devices such as laptop computers 70, control room workstations 72, and the like. The communications ports 66, 68 can provide hardwired communications or wireless communications. Example communications ports include universal serial bus (USB), Ethernet and RS485. Various parameter settings of the electronic trip unit 20 and/or the local interface 40 can be set through the user interface device 28 and also through communications received through the communications ports 66, 68. For example, the electronic trip unit 20 can receive or derive the threshold tripping duration from communications through the communications ports 66, 68. The laptop computer 70 and/or the control room workstation 72 can run programming software for programming the electronic trip unit 20 and/or the local interface 40. Further, the laptop computer 70 and the control room workstation 72 can display current operating conditions (e.g., phase current levels) of the electronic trip unit 20, current alarm conditions, and stored historical data (e.g., alarm histories).

The electronic trip unit 20 disclosed herein can be used with low voltage circuit breakers (e.g., 600 V class) requiring a trip unit. However, it is to be appreciated the electronic trip unit can also be used with any higher voltage class circuit breaker requiring a trip unit, such as medium voltage circuit breakers, for example.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. A method of determining sluggish operation of a circuit breaker, the circuit breaker including an actuator, the method comprising the steps of:
   providing an electronic trip unit for the circuit breaker;
   setting a threshold tripping duration in the electronic trip unit;
   determining an existence of an abnormal current condition by the electronic trip unit;
   sending a trip signal to the actuator by the electronic trip unit due to the abnormal current condition;
   tripping the circuit breaker by the actuator;
   monitoring, by the electronic trip unit during the tripping, at least one of a change of a level of electrical current flowing through the circuit breaker, a change of a level of voltage present at the circuit breaker, and a contact state change of a circuit breaker auxiliary contact;
   determining, by the electronic trip unit, a tripping duration of the circuit breaker from a timing of sending the trip signal to the actuator and a timing of the at least one of the change of the level of electrical current, the change of the level of voltage, and the contact state change of the circuit breaker auxiliary contact, wherein the tripping duration corresponds to a length of time required for the circuit breaker to be tripped and open, and further wherein the tripping duration is a time difference between the timing of sending the trip signal to the actuator and the timing of the at least one of the change of the level of electrical current, the change of the level of voltage, and the contact state change of the circuit breaker auxiliary contact, such that said time difference is an elapsed time for the actuator to trip the circuit breaker and the circuit breaker to open, and the elapsed time excludes a time required for the electronic trip unit to recognize the abnormal current condition;
   comparing, by the electronic trip unit, the tripping duration to the threshold tripping duration to determine a sluggish operation of the circuit breaker.

2. The method of claim 1, wherein the step of determining, by the electronic trip unit, a tripping duration includes:
   determining a first tripping duration for a first electrical phase of the circuit breaker;
   determining a second tripping duration for a second electrical phase of the circuit breaker; and
   determining a third tripping duration for a third electrical phase of the circuit breaker.

3. The method of claim 1, further comprising the step of sending a trip signal to an upstream circuit breaker based on a result of the step of comparing.

4. The method of claim 1, wherein the electronic trip unit automatically determines the threshold tripping duration.

5. The method of claim 4, wherein the electronic trip unit automatically determines the threshold tripping duration based on a previous tripping duration of a previous tripping of the circuit breaker, wherein the previous tripping duration is calculated by the electronic trip unit.

6. The method of claim 5, wherein the electronic trip unit calculates the previous tripping duration based on a first tripping duration for a first electrical phase of the circuit breaker, a second tripping duration for a second electrical phase of the circuit breaker, and a third tripping duration for a third electrical phase of the circuit breaker.

7. The method of claim 1, wherein the threshold tripping duration is manually entered into the electronic trip unit, derived from a manually entered duration, or derived from manually entered circuit breaker information.

8. The method of claim 1, wherein the electronic trip unit includes a communications port, and the electronic trip unit receives or derives the threshold tripping duration from communications through the communications port.

9. The method of claim 1, further comprising the steps of:
   setting a stuck circuit breaker duration in the electronic trip unit; and
   determining, by the electronic trip unit, a stuck circuit breaker condition of the circuit breaker using the stuck circuit breaker duration.

10. A circuit breaker electronic trip unit, comprising:
   a controller;
   a memory that stores a threshold tripping duration, wherein the memory is readable by the controller;
   an input section for receiving at least one of a phase current level signal, a phase or line voltage level signal, and a contact state change signal, wherein the circuit breaker electronic trip unit can determine an existence of an abnormal current condition based on the phase current level signal; and
   a trip signal output;
   wherein the circuit breaker electronic trip unit activates the trip signal output due to the existence of the abnormal current condition, and monitors the input section for a predetermined signal change,
   wherein the circuit breaker electronic trip unit determines a tripping duration from a timing of the activation of the trip signal output and a timing of the predetermined signal change, wherein the tripping duration corresponds to a length of time required for a circuit breaker to be tripped and open, and further wherein the tripping duration is a time difference between the timing of the activation of the trip signal output and the timing of the predetermined signal change, such that said time difference is an elapsed time for an actuator to trip the circuit breaker and the circuit breaker to open, and the elapsed time excludes a time required for the electronic trip unit to recognize the existence of the abnormal current condition, and
   wherein the circuit breaker electronic trip unit compares the tripping duration to the threshold tripping duration to determine a sluggish circuit breaker operation.

11. The circuit breaker electronic trip unit of claim 10, wherein the input section receives the phase current level signal, and, additionally, a second phase current level signal and a third phase current level signal,
   wherein the circuit breaker electronic trip unit determines a second tripping duration from the timing of the activation of the trip signal output and a timing of a predetermined signal change of the second phase current level signal, and wherein the circuit breaker electronic trip unit determines a third tripping duration from the timing of the activation of the trip signal output and a timing of a predetermined signal change of the third phase current level signal.

12. The circuit breaker electronic trip unit of claim 10, wherein the circuit breaker electronic trip unit further includes a sluggish circuit breaker alarm output and an upstream circuit breaker trip output.

13. The circuit breaker electronic trip unit of claim 12, wherein the memory further stores a stuck circuit breaker duration, and
wherein when the predetermined signal change does not occur within the stuck circuit breaker duration immediately after the timing of the activation of the trip signal output, the circuit breaker electronic trip unit controls the upstream circuit breaker trip output to trip an upstream circuit breaker.

14. The circuit breaker electronic trip unit of claim 10, wherein the circuit breaker electronic trip unit automatically determines the threshold tripping duration.

15. The circuit breaker electronic trip unit of claim 14, wherein the circuit breaker electronic trip unit automatically determines the threshold tripping duration based on a previous tripping duration of a previous tripping operation, and wherein the previous tripping duration is calculated by the circuit breaker electronic trip unit.

16. The circuit breaker electronic trip unit of claim 15, wherein the circuit breaker electronic trip unit calculates the previous tripping duration based on a first electrical phase tripping duration, a second electrical phase tripping duration, and a third electrical phase tripping duration.

17. The circuit breaker electronic trip unit of claim 10, further comprising a user interface device in communication with the controller,
wherein the user interface device provides an indication of the sluggish circuit breaker operation, and
wherein the threshold tripping duration is manually entered into the circuit breaker electronic trip unit from the user interface device or derived from information manually entered into the circuit breaker electronic trip unit from the user interface device.

18. The circuit breaker electronic trip unit of claim 10, wherein the circuit breaker electronic trip unit includes a communications port, and the circuit breaker electronic trip unit receives or derives the threshold tripping duration from communications through the communications port.

19. A circuit protection system, comprising:
the circuit breaker electronic trip unit of claim 10;
the circuit breaker; and
the actuator, wherein the actuator receives a trip signal from the trip signal output and trips the circuit breaker based on receiving the trip signal.

* * * * *